(12) United States Patent
Jaworski et al.

(10) Patent No.: US 7,478,298 B2
(45) Date of Patent: Jan. 13, 2009

(54) METHOD AND SYSTEM FOR BACKPLANE TESTING USING GENERIC BOUNDARY-SCAN UNITS

(75) Inventors: Douglas S. Jaworski, St. Petersburg, FL (US); Daniel W. Snider, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 291 days.

(21) Appl. No.: 11/340,286

(22) Filed: Jan. 26, 2006

(65) Prior Publication Data

US 2007/0174748 A1 Jul. 26, 2007

(51) Int. Cl.
*G01R 31/28* (2006.01)
(52) U.S. Cl. .......................... 714/727; 714/25; 714/30; 714/715; 714/716; 714/717; 714/726; 714/729; 714/742; 714/824; 702/168; 324/527
(58) Field of Classification Search ........................ None
See application file for complete search history.

(56) References Cited

U.S. PATENT DOCUMENTS

| | | | |
|---|---|---|---|
| 5,621,312 A | | 4/1997 | Achor et al. |
| 5,627,842 A * | | 5/1997 | Brown et al. ................. 714/727 |
| 5,642,363 A * | | 6/1997 | Smith .......................... 714/729 |
| 5,659,552 A * | | 8/1997 | Ke et al. ....................... 714/727 |
| 5,717,420 A * | | 2/1998 | Matsuzaki et al. ............. 345/97 |
| 5,841,788 A * | | 11/1998 | Ke .............................. 714/726 |
| 6,067,506 A * | | 5/2000 | Goldys et al. ............... 702/117 |
| 6,161,205 A | | 12/2000 | Tuttle |
| 6,229,325 B1 | | 5/2001 | Browning et al. |
| 6,363,510 B1 | | 3/2002 | Rhodes et al. |
| 6,433,569 B1 | | 8/2002 | Eliashberg et al. |
| 6,822,469 B1 | | 11/2004 | Kline |
| 6,900,650 B1 | | 5/2005 | Sheng et al. |
| 6,910,162 B2 | | 6/2005 | Co et al. |
| 7,111,211 B1 | | 9/2006 | Co et al. |
| 7,208,968 B2 | | 4/2007 | Weber et al. |
| 7,265,556 B2 * | | 9/2007 | Van Treuren et al. ........ 324/538 |
| 2003/0229835 A1 * | | 12/2003 | Whetsel ....................... 714/727 |
| 2005/0081100 A1 * | | 4/2005 | Zeng et al. .................... 714/25 |
| 2006/0242511 A1 * | | 10/2006 | Whetsel ....................... 714/727 |
| 2007/0136631 A1 * | | 6/2007 | Govani et al. ................ 714/738 |
| 2007/0300109 A1 * | | 12/2007 | Whetsel ....................... 714/727 |

* cited by examiner

*Primary Examiner*—John P Trimmings
(74) *Attorney, Agent, or Firm*—Fogg & Powers LLC

(57) ABSTRACT

A test system for testing a backplane comprising an adapter assembly and a generic boundary-scan test unit. The adapter assembly includes an application-specific mating connector to communicatively couple the adapter assembly to an application-specific port of a backplane and an adapter generic connector. The generic boundary-scan test unit includes a test card generic connector to communicatively couple the generic boundary-scan test unit to the adapter generic connector of the adapter assembly and boundary-scan functionality to transmit at least one output test signal. The backplane is tested by communicating the output test signal from the generic boundary-scan test unit to the application-specific mating connector for testing the backplane and communicating at least one input test signal received from the backplane via the application-specific mating connector to the boundary-scan functionality of the generic boundary-scan test unit.

20 Claims, 5 Drawing Sheets

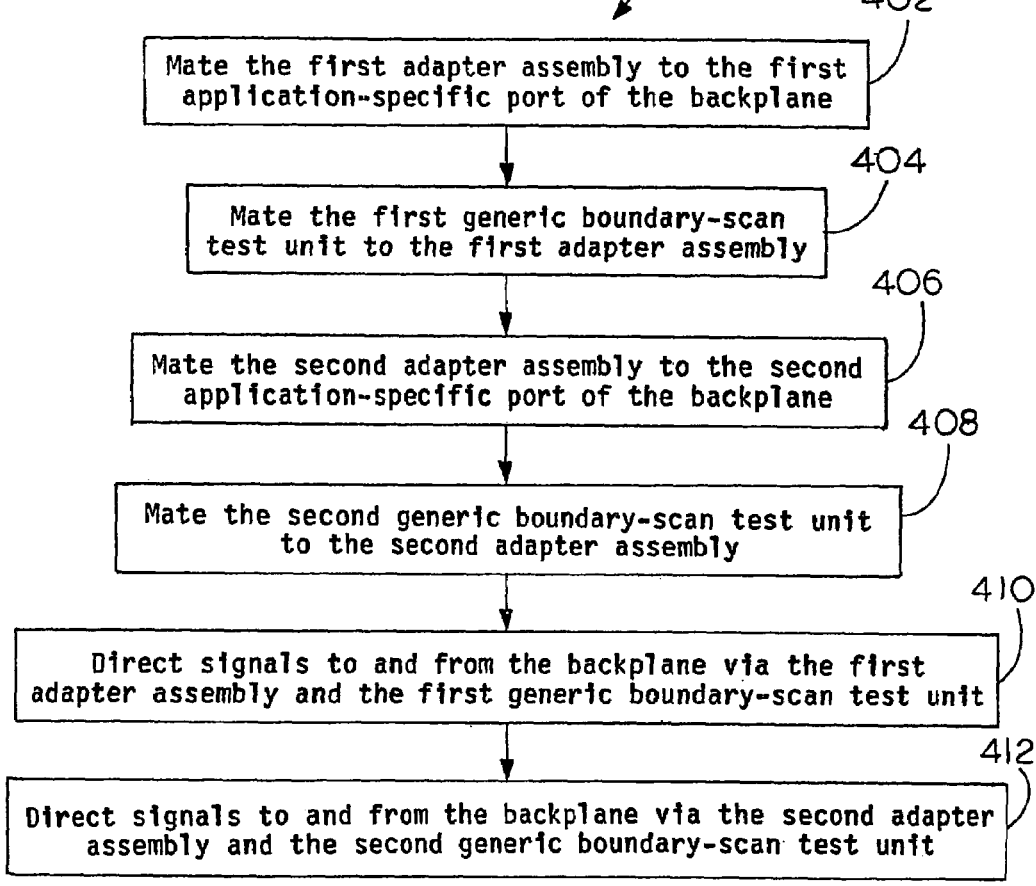

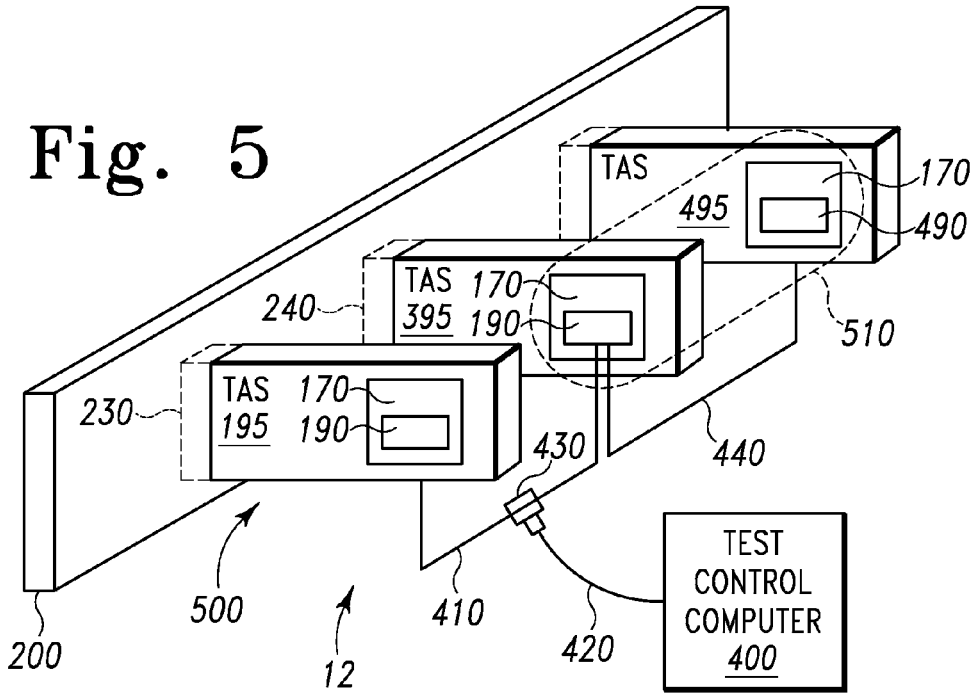

ional backplane.
METHOD AND SYSTEM FOR BACKPLANE TESTING USING GENERIC BOUNDARY-SCAN UNITS

GOVERNMENT LICENSE RIGHTS

The U.S. Government may have certain rights in the present invention as provided for by the terms of a restricted government contract.

This application is related to U.S. patent application Ser. No. 11/340,295, having a title of "BOUNDARY-SCAN SYSTEM ARCHITECTURE FOR REMOTE ENVIRONMENTAL TESTING" and U.S. patent application Ser. No. 11/340,390, having a title of "DIAGNOSTICS UNIT USING BOUNDARY-SCAN TECHNIQUES FOR VEHICLES", both of which are filed on the same date herewith.

BACKGROUND

Backplanes often include several application-specific ports through which data is input and/or output. The application-specific ports are operable to mate with application specific connectors. When a backplane is tested, pin to pin interconnects between the backplanes are manually verified using DC methods. During backplane testing, a technician probes one or more pins in the one or more application-specific ports. When a backplane is complex, there may be thousands of manual test points and pairs of test points to be individually probed during a complete testing of the complex backplane. Thus, DC testing of a backplane is labor intensive and expensive.

When a backplane is a high speed differential backplane, the manual DC probing does not identify and/or isolate impedance problems with the backplane. In that case, DC testing of a backplane is inadequate to indicate a potential problem with the backplane.

SUMMARY

A first aspect of the present invention provides a test system for testing a backplane. The system comprises an adapter assembly and a generic boundary-scan test unit. The adapter assembly includes an application-specific mating connector to communicatively couple the adapter assembly to an application-specific port of a backplane and an adapter generic connector. The generic boundary-scan test unit includes a test card generic connector to communicatively couple the generic boundary-scan test unit to the adapter generic connector of the adapter assembly and boundary-scan functionality to transmit at least one output test signal. The test card generic connector is communicatively coupled to the adapter generic connector in order to test the backplane. The backplane is tested by communicating the output test signal from the generic boundary-scan test unit to the application-specific mating connector for testing the backplane and communicating at least one input test signal received from the backplane via the application-specific mating connector to the boundary-scan functionality of the generic boundary-scan test unit via the adapter generic connector of the adapter assembly and the test card generic connector for testing the backplane.

A second aspect of the present invention provides a method to test a backplane while the backplane operates at signaling speeds. The method includes mating a first adapter assembly to a first application-specific port of the backplane using an application-specific connector of the first adapter assembly, mating a first generic boundary-scan test unit to the first adapter assembly, wherein the first generic boundary-scan test unit comprises at least one of IEEE 1149.6 functionality, IEEE 1149.1 functionality and directing signals to and from the backplane via the first adapter assembly and the first generic boundary-scan test unit.

A third aspect of the present invention provides a method to test a backplane as the backplane operates at signaling speeds. The method includes mating a first adapter-assembly to a first application-specific port of the backplane, mating a first generic boundary-scan test unit to the first adapter assembly and directing signals to and from the backplane via the first adapter assembly and the first generic boundary-scan test unit.

A fourth aspect of the present invention provides a generic boundary-scan test unit. The generic boundary-scan test unit includes a generic connector to connect the generic boundary-scan test unit with an adapter assembly via a printed wiring board and a boundary-scan bridge communicatively coupled to the generic connector. The boundary-scan bridge is operable to communicate a test signal generated in accordance with at least one of IEEE 1149.1 and IEEE 1149.6. The boundary-scan functionality communicatively coupled to the boundary-scan bridge is operable to communicate with more than one type of application-specific port.

DRAWINGS

FIG. 4 is a flow diagram of one embodiment of a method to test a backplane.

FIG. 5 is a block diagram of one embodiment of a system including a plurality test adapter systems mated to the backplane of FIG. 1.

FIG. 6 is a flow diagram of one embodiment of a method to test a backplane.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
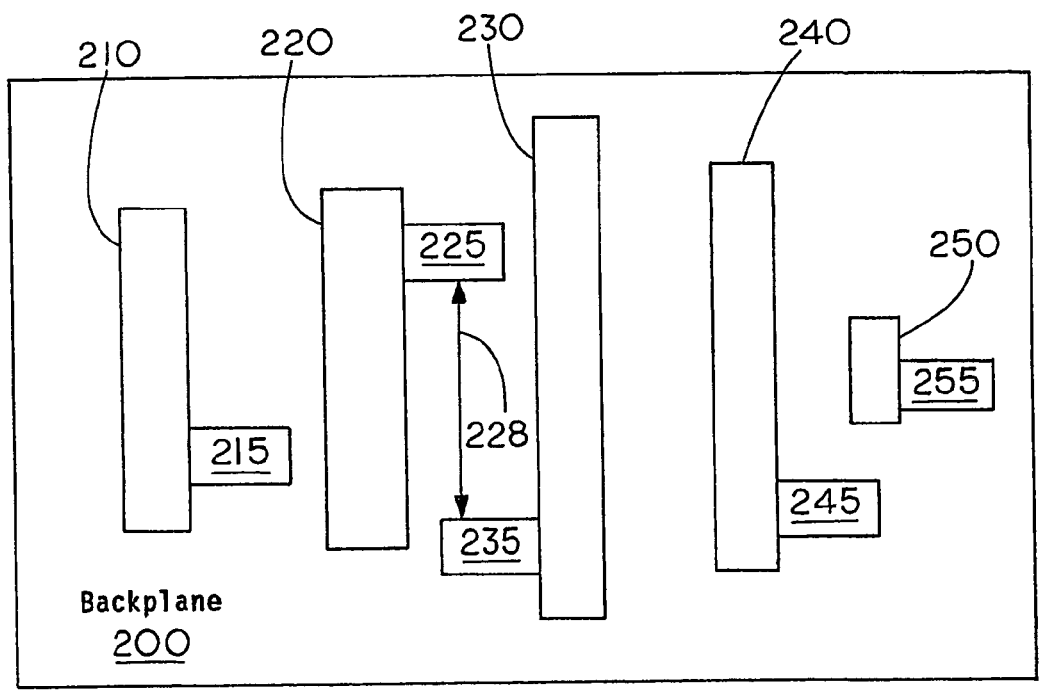
FIG. 1 is a block diagram of one embodiment of a conventional backplane.

FIG. 1 is a block diagram representative of a conventional backplane 200. The testing techniques, devices, and systems described here can be used to test embodiments and implementations of the backplane 200 shown in FIG. 1. The exemplary backplane 200 comprises application-specific ports 210, 220, 230, 240 and 250. Each of the application-specific ports 210, 220, 230, 240 and 250 has a different size and shape to emphasize that each of the application-specific ports 210, 220, 230, 240 and 250 are a different type of port and they each function in a different manner. In other embodiments of a backplane, two or more (even all) of the application-specific ports are of the same type.

In the embodiment of the backplane 200 shown in FIG. 1, each of the application-specific ports 210, 220, 230, 240 and 250 are associated with backplane circuitry 215, 225, 235, 245 and 255, respectively. In one implementation of this embodiment, one or more of the backplane circuitry 215, 225, 235, 245 and 255 are interconnected with each other, as indicated by exemplary connection 228. In one implementation of such a backplane 200, the backplane 200 comprises a complex backplane[s] that can operate at high signaling speeds.

In general, each of the application-specific ports 210, 220, 230, 240 and 250 of the backplane 200 is designed for use with a particular application-specific module or card (not shown). Such an application-specific module is communicatively coupled to the backplane 200 by connecting the application-specific connector of the application module to a respective application-specific port of the backplane 200.

Figure 2:
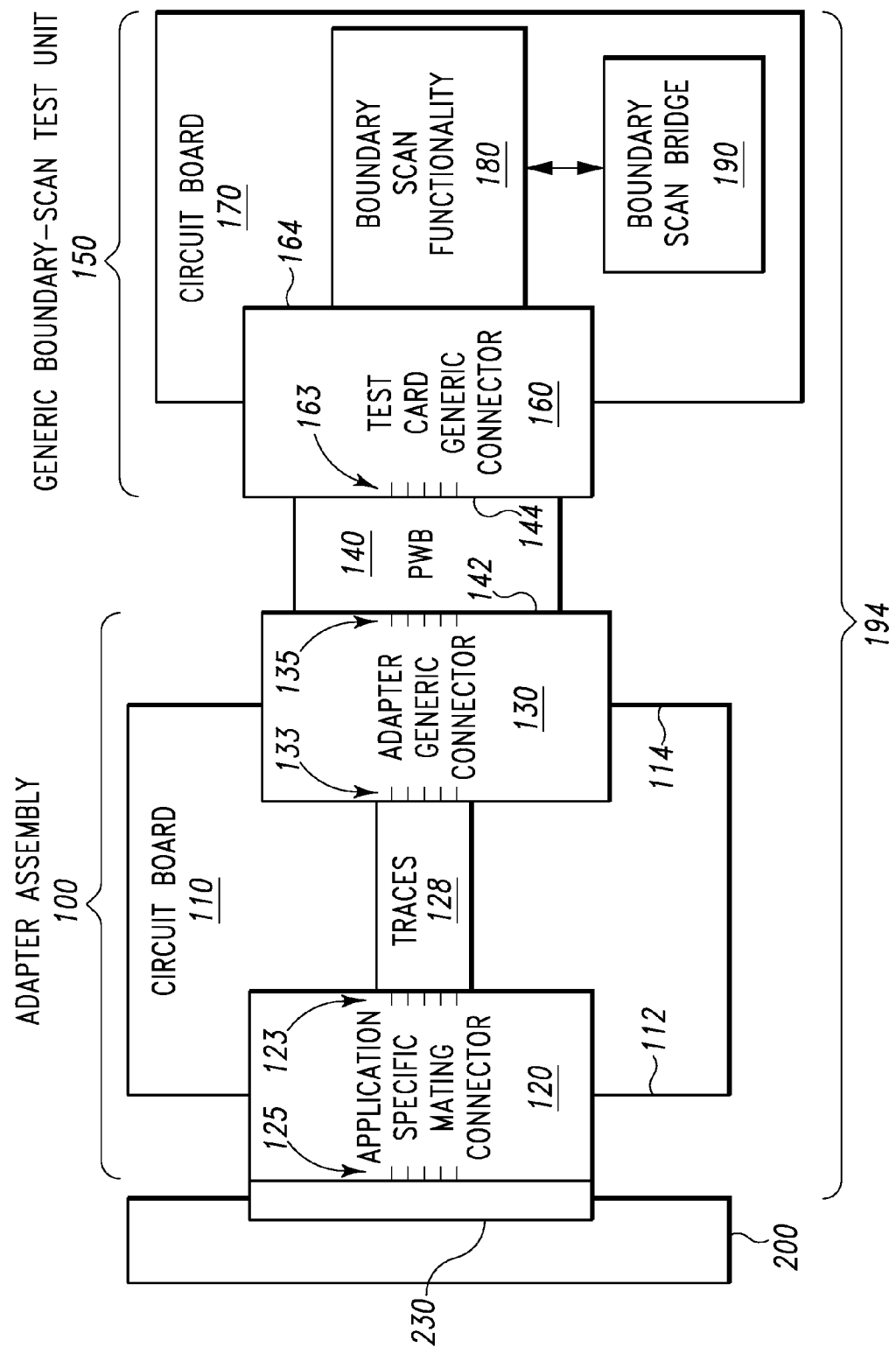
FIG. 2 is a block diagram of one embodiment a test adapter system mated to the backplane of FIG. 1.

FIG. 2 is a block diagram of one embodiment of a test adapter system 194 mated to a backplane 200 of FIG. 1. The test adapter system 194 comprises an adapter assembly 100, a generic boundary-scan test unit 150 and a printed wiring board (PWB) 140. The adapter assembly 100 (also referred to here as the "adapter assembly" 100) includes a circuit board 110, an application-specific mating connector 120 and an adapter generic connector 130. The application-specific mating connector 120 is located at a first edge 112 of the circuit board 110 and is adapted to mate to an application-specific port 230 of a backplane. The application-specific mating connector 120 of the adapter assembly 100 is "adapted to" mate with a particular application-specific port of such a backplane 200 (port 230 in the example illustrated in FIG. 2), in one implementation, by selecting a connector that is able to mate with (that is, connect to) the application-specific port 230 of such a backplane 200 (for example, by using the same type of connector as used on the respective application module to communicatively couple the application module to the backplane).

The adapter generic connector 130 of the adapter assembly 100 is located at a second edge 114 of the circuit board 110. The adapter generic connector 130 is adapted to receive control signals and test signals from a generic boundary-scan unit (described below) via the printed wiring board 140. As used herein, a "test" signal is a signal that is communicated between and among the application-specific port of a backplane that is being tested and a generic boundary-scan test unit (and any test device coupled thereto) and a "control" signal is a signal that is communicated between and among the adapter assembly 100 and the generic bound-scan test unit to control and/or configure one or more of adapter assembly 100 (and connectors included thereon), printed wiring board 140, and the generic boundary-scan test unit 150.

The circuit board 110 communicatively couples the adapter generic connector 130 to the application-specific mating connector 120 so that test signals received at the adapter generic connector 130 from a generic boundary-scan unit 150 are communicated to the application-specific mating connector 120 for ultimate communication to the application-specific port 230 of any backplane 200 that is connected to the application-specific mating connector 120. In the embodiment shown in FIG. 1, the adapter generic connector 130 comprises a set of pins 135 (or other conductive terminals) that are arranged so that each of the set of pins 135 is able to mate with a corresponding socket (or other receptacle) included in a corresponding generic connector 142 located on the printed wiring board 140. Also, in such an embodiment, the adapter generic connector 130 further comprises a set of terminals 133 that communicatively couple adapter generic connector 130 to the circuit board 110.

In one implementation of this embodiment, no active circuitry is included on the circuit board 110 but instead the circuit board 110 comprises conductive traces 128. The traces 128 include one or more of trace lines, lead lines, wires and the like. The traces 128 connect one or more terminals 133 of the first generic connector 130 to one or more of a set of terminals 123 of the application-specific mating connector 120. The terminals 123 of the application-specific mating connector 120 communicatively couple the application-specific mating connector 120 to the circuit board 110. In the embodiment shown in FIG. 1, the application-specific mating connector 120 further comprises a set of pins 125 (or other conductive terminals) that are arranged so that each of the set of pins 125 is able to mate with a corresponding socket (or other receptacle) included in the application-specific port 230 of the backplane 200 that is to be tested using the test adapter system 194.

The printed wiring board 140 communicatively couples the adapter assembly 100 to the generic boundary-scan test unit 150.

The generic boundary-scan test unit 150 comprises a circuit card or board 170 on which a test card generic connector 160 is located. The adapter generic connector 130 of the adapter assembly 100 is also referred to here as the "first" generic connector 130 and the test card generic connector 160 of the generic boundary-scan test unit 150 is also referred to here as the "second" card generic connector 160 to distinguish the connector 130 from the connector 160. The second generic connector 160 comprises a set of pins 163 that are arranged so that each of the set of pins 163 is able to mate with a corresponding socket (or other receptacle) included in a corresponding generic connector 144 located on the printed wiring board 140. The circuit board 170 includes boundary-scan functionality 180 and a boundary scan bridge 190. The boundary scan functionality 180 is communicatively coupled to the boundary scan bridge 190. The boundary scan functionality 180 is also communicatively coupled to the second generic connector 160.

One or more of the pins 163 of the second generic connector 160 are communicatively coupled to one or more of the set of pins 135 of the first generic connector 130 of the adapter assembly 100 via traces (or other conductors) (not shown) included in the printed wiring board 140. In other embodiments, the printed wiring board 140 is replaced by connections such as wires, adapters and the like as is understandable by one skilled in the art.

The boundary-scan functionality 180 is adapted to "toggle" specific ones of the pins 163 according to control signals received at the boundary scan bridge 190. As used herein, "toggle" refers to using a particular pin (or other terminal, trace, or conductor) to communicate a particular test signal on that pin. By causing the boundary-scan functionality 180 to communicate particular test signals on particular pins 163 of the second generic connector 160 (and particular pins 135 of the first generic connector 130), the control signals logically configure the first generic connector 130 and the second generic connector 160 according to the type of application-specific port 230 mated to the adapter assembly 100. In this way, the generic boundary-scan test unit 150 is able to be used test multiple types of backplanes. In one implementation of this embodiment, the boundary-scan functionality 180 comprises functionality for testing at least one of alternating current (AC) coupled nets or direct current (DC) differential nets that are included in the backplane 200. Examples of such boundary-scan functionality include functionality that supports the Institute of Electrical and Electronics Engineers (IEEE) 1149.6, IEEE 1149.4 and IEEE 1149.1 standards.

Although the adapter assembly 100, the printed wiring board 140, the generic boundary-scan test unit 150, and the backplane 200 are shown in FIG. 1 in a connected, assembled state, it is to be understood that each of these parts are separable so that the generic boundary-scan test unit 150 (as well as the adapter assembly 100 and the printed wiring board 140) can be used to test other backplanes or devices. The generic boundary-scan test unit 150 can be used to test other types of backplanes or other application-specific ports of a particular backplane by using an adapter assembly that has an application-specific mating connector that mates with the particular application-specific port to be tested. The generic boundary-scan test unit 150 is than connected to such an adapter assembly via a suitable printed wiring board 140. In this way, a generic boundary-scan test unit 150 (or a set thereof) can be used to test multiple different types of backplanes or other devices having different types of application-specific ports.

Figure 3:
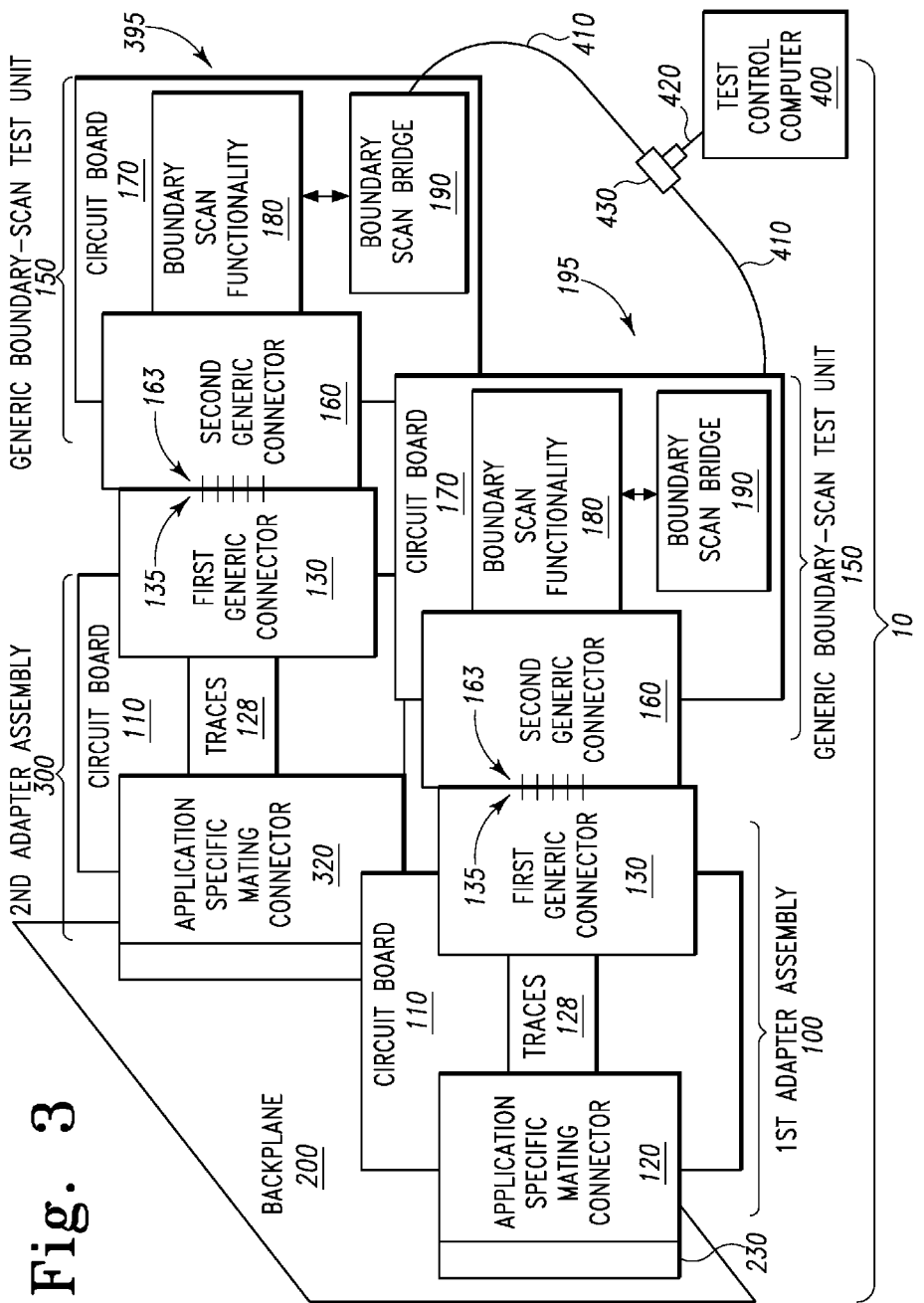
FIG. 3 is a block diagram of one embodiment of a system including two test adapter systems mated to the backplane of FIG. 1.

FIG. 3 is a block diagram of a system 10 including two test adapter systems 195 and 395 mated to a backplane 200. The test adapter system 195 and test adapter system 395 are configured to be under the control of a test control computer 400 during a test of the backplane 200. The test adapter system 195 comprises an adapter assembly 100 and a generic boundary-scan test unit 150. The second generic connector 160 of the generic boundary-scan test unit 150 mates directly to the first generic connector 130 of the adapter assembly 100 without the printed wiring board of the test adapter system 194 in FIG. 2. The second generic connector 160 comprises a set of pins 163 that are arranged so that each of the set of pins 163 is able to mate with a corresponding socket (or other receptacle) included in a corresponding first generic connector 130. One or more of the pins 163 of the second generic connector 160 are directly connected to one or more of the set of pins 135 of the first generic connector 130 of the adapter assembly 100.

The test adapter system 395 comprises an adapter assembly 300 and a generic boundary-scan test unit 150. The second generic connector 160 of the generic boundary-scan test unit 150 mates directly to the first generic connector 130 of the adapter assembly 300. The test adapter system 395 is functionally the same as the test adapter system 195 except that the application-specific mating connector 320 is adapted for the particular application-specific port 240 of the backplane 200. In other words, the same type of generic boundary-scan test unit 150 can be used to test two different types of application-specific ports 230 and 240 by appropriately adapting the application-specific mating connector of the respective adapter assembly.

The test control computer 400 is adapted to send signals via connection 420 and connection 410 to test adapter system 195 and test adapter system 395. The test control computer 400 sends both test signals and control signals. The control signals are operable to configure the first generic connector 130 and the second generic connector 160 so that the signals required for the specific application of the specific application port are received at the specific application port. The test signals are operable to test application-specific port 230 in the backplane 200. The test control computer 400 sends the test signals to the backplane 200 via one or more of the boundary scan bridges 190 on the respective generic boundary scan test unit 170. For example, in one implementation, the test control computer 400 executes appropriate test software that causes the test control computer 400 to send such signals. The test control computer 400 includes appropriate interfaces (for example, general-purpose interfaces such as RS-232 serial or Universal Serial Bus (USB) serial interface or a General Purpose Interface Bus (GPIB) interface or special purpose interfaces).

FIG. 4 is a flow diagram of one embodiment of a method 400 to test a backplane. The particular embodiment of method 400 shown in FIG. 4 is described here as being implemented for use with the test adapter system described above in connection with FIGS. 2 and 3 to test the backplane 200 of FIG. 1, for example, while the backplane 200 is operating at signal speeds, including high-speed signaling speeds. Once the test control computer 400 sends appropriate control signals to configure the first and second generic connectors 130 and 160 by toggling the pins thereof, the test adapter system 195 and test adapter system 395 do not limit the signaling speed.

At block 402 the first adapter assembly 100 of test adapter system 195 is mated to the first application-specific port 230 of the backplane 200. At block 404, the first generic boundary-scan test unit 150 is mated to the first adapter assembly 100 to complete the test adapter system 195. As shown in FIG. 2, the printed wiring board 140 is an adapter that mates the first generic boundary-scan test unit 150 to the first adapter assembly 100. In one implementation of this embodiment, the first generic boundary-scan test unit 150 mates directly to the first adapter assembly 100. In such an embodiment, the first generic connector 130 mates to the second generic connector 160 as shown in FIG. 3. In one implementation of this embodiment, the backplane 200 wraps a signal "IN" from an input pin on an application specific connector as a signal "OUT" to an output put on the same application specific connector.

At block 406, the second adapter assembly 300 is mated to the second application-specific port 240 of the backplane 200. At block 408, the second generic boundary-scan test unit 150 is mated to the second adapter assembly 300 to complete test adapter system 395. In one implementation of this embodiment, the boundary-scan functionality 180 of both generic boundary-scan test units 150 comprise functionality for testing at least one of alternating current (AC) coupled nets or differential nets that are included in the backplane 200. Examples of such boundary-scan functionality include functionality that supports the Institute of Electrical and Electronics Engineers (IEEE) 1149.6, IEEE 1149.4 and IEEE 1149.1 standards.

At block 410, the test control computer 400 directs signals to and from the backplane 200 via the first adapter assembly 100 and the first generic boundary-scan test unit 150. The signals include control signals to toggle pins and test signals to test the backplane 200. The test control computer 400 receives test response signals from the backplane 200 in response to the test signals being received at the backplane 200. In this manner the test control computer 400 is able to test the backplane 200 via test adapter system 195 by using boundary scan technology while the backplane 200 is operating at the signaling speeds that are appropriate for the backplane 200.

At block 412, the test control computer 400 directs signals to and from the backplane 200 via the second adapter assembly 300 and the second generic boundary-scan test unit 150. In this manner the test control computer 400 is able to test the backplane 200 via test adapter system 395 by using boundary scan technology while the backplane 200 is operating at the signaling speeds that are appropriate for the backplane 200.

FIG. 5 is a block diagram of one embodiment of a system 12 that comprises a plurality of test adapter systems (TAS) 195, 395, and 495 mated to a backplane 200 of the type described above in connection with FIG. 1. The plurality of test adapter systems (TAS) 195, 395, and 495 are configured to be under the control of test control computer 400 while the test control computer 400 tests the backplane 200. The test adapter system 195 and test adapter system 395 are as described above in connection with FIGS. 2 and 3. The test adapter system 495 is the same as the test adapter system 195 described above in connection with FIG. 2 except for an application-specific mating connector (not shown in FIG. 5) that is adapted for the particular application-specific port 250 of the backplane 200 to which that connector is mated. In other words, the same type of generic boundary-scan test unit 150 can be used to test three different types of application-specific ports 230, 240, and 250 by appropriately adapting the application-specific mating connector of the respective adapter assembly.

The generic boundary-scantest units 150 of systems 395 and 495 are representative of a plurality of generic boundary-scan test units 150, which are defined herein as other generic boundary-scan test units 510 with respect to the generic boundary-scan test units 150. In one implementation of this embodiment, additional generic boundary-scan test units are included in the other generic boundary-scan test units 510. The generic boundary-scan test unit 150 of test adapter system 195 and each of the plurality of other generic boundary-scan test units 510 is communicatively coupled to a respective application-specific port 230, 240 and 250 of the backplane 200 via a respective adapter assembly (not shown in FIG. 5).

The boundary-scan bridge 190 of each generic boundary-scan test unit 150 is adapted to communicate with the other boundary-scan bridges 190 in the system 12. In the particular embodiment shown in FIG. 1, the boundary-scan bridge 190 of test adapter system 195 is connected to the boundary-scan bridge 190 of test adapter system 395 via connection 410 and connector tap 430. The boundary-scan bridge 190 of test adapter system 395 is connected to the boundary-scan bridge 490 of test adapter system 495 via connection 440. In this way, the generic boundary-scan-test units 150 of the systems 195, 395, and 495 comprise a boundary-scan chain 500. The test control computer 400 is connected to the boundary-scan chain 500.

In one implementation of this embodiment, the application-specific ports 230, 240 and 250 of the backplane 200 are the same type of application-specific port. In another implementation of this embodiment, one or more of the application-specific ports 230, 240 and 250 differ in type from one or more of the other application-specific ports. In yet another implementation of this embodiment, each of the application-specific ports 230, 240 and 250 differs from each other.

FIG. 6 is a flow diagram of one embodiment of a method 600 to test a backplane 200. The particular embodiment of method 600 shown in FIG. 6 is described here as being implemented for use with the test adapter systems and the boundary-scan chain 500 shown in FIG. 5 to test the backplane 200 of FIG. 1, for example, while the backplane 200 is operating at signal speeds, including high-speed signaling speeds The embodiment shown in FIG. 6 is described here as being performed after method 600 of FIG. 6 has been performed to form each of the test assembly systems 195, 395 and 495 shown in FIG. 5. Once the boundary scan chain 500 is formed by the connections 410 and 440 and connector 430, the test control computer 400 sends appropriate control signals to configure the first and second generic connectors 130 and 160 by toggling the pins thereof of systems 195, 395, and 495.

Once the pins are in the proper configuration for the desired test, the test signals from the test control computer 400 are directed as needed for the signaling speed in the backplane 200. In one implementation, the traces 128 and connections 410, 440, and 420 and the connections in the printed wiring boards 140 are designed for the highest desired signaling speed necessary to test the backplane 200.

At block 602, the first boundary-scan bridge 190 on the first generic boundary-scan test unit 150 of test adapter system 195 is connected to the boundary-scan bridge 190 on the second generic boundary-scan test unit 150 of test adapter system 395 via connection 410. In this manner, the test adapter system 195 is linked to the test adapter system 395. The backplane circuitry 235 associated with the first application-specific port 230 and backplane circuitry 245 associated with the second application-specific port 240 are linked by such connections.

The second boundary-scan bridge 190 on the generic boundary-scan test unit 150 of test adapter system 395 is connected to the boundary-scan bridge 490 on the generic boundary-scan test unit of test adapter system 495 via connection 440. In this manner, the test adapter system 495 is linked to the test adapter system 395 and test adapter system 195 in a boundary scan chain 500. The backplane circuitry associated with each application-specific port 230, 240 and 250 are all linked by the boundary scan chain 500.

At block 604, the first boundary-scan bridge 190 of the generic boundary-scan test unit 150 of test adapter system 195 and the boundary-scan bridge 190 of the generic boundary-scan test unit 150 of the test adapter system 395 are communicatively coupled to the test control computer 400 via connection 420 and connection 410. The second boundary-scan bridge 190 of test adapter system 395 and the boundary-scan bridge 190 of test adapter system 395 are communicatively coupled to the test control computer 400 via connection 420, connection 410 and connection 440.

At block 606, the test control computer 400 sends signals to the first boundary-scan-bridge 190 of test adapter system 195. At block 608, the test control computer 400 tests the backplane circuitry 235 associated with the first application-specific port 230 and the backplane circuitry 245 associated with the second application-specific port 240. In one implementation of this embodiment, the test control computer 400 tests the backplane circuitry 235 and the backplane circuitry 245 according to IEEE 1149.6 standard and/or IEEE 1149.1 standard. The test control computer 400 sends control signal and test signals as described above with reference to FIG. 3.

The test control computer 400 is also capable to test the backplane circuitry associated with the application-specific port 250. In one implementation of this embodiment, the application-specific ports 230, 240 and 250 are the same type of application-specific port with the same configuration and functionality. In another implementation of this embodiment, one or more of the application-specific ports 230, 240 and 250 have types, configurations, or functionalities that are different from one or more of the other application-specific ports. The test control computer 400 is adapted to send control signals to configure the test adapter systems 195, 395 and 495 and then to send the appropriate test signals to each of the respective application-specific ports 230, 240 and 250. Likewise, the test control computer 400 is adapted to receive test response signals from the backplane 200 via each of the respective application-specific ports 230, 240 and 250 and via the test adapter systems 195, 395 and 495.

In one implementation of this embodiment, the test control computer 400 is adapted to send and receive indicator signals to and from each of the application-specific ports 230, 240 and 250 via the respective test adapter systems 195, 395 and 495 in order to recognize the type of application-specific port. In this manner the test control computer 400 recognizes what kind of control signals to send to the test adapter systems 195, 395 and 495 via connection 420 and 410. In one implementation of this embodiment, the test control computer 400 is connected to a commercial off the shelf (COTS) JTAG POD which is controlled by COTS software. In another implementation of this embodiment, a commercially available Quad-POD™ system from "JTAG Technologies" can be implemented to provide a parallel gain programming or testing of four generic boundary-scan test units 150 or to provide a parallel gain programming or testing of one or more boundary-scan test units 150 for multiple chain operations all according to IEEE 1149.6 standard and/or IEEE 1149.1 standard.

In another implementation of this embodiment, a user of the test control computer 400 inputs data about the type of application-specific port to which the test control computer 400 is connected. The user enters such input data using a user/computer interface as is known in the art.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A test system for testing a backplane comprising:
an adapter assembly; and
a generic boundary-scan test unit;
wherein the adapter assembly comprises:
an application-specific mating connector to communicatively couple the adapter assembly to an application-specific port of a backplane; and
an adapter generic connector; and
wherein the generic boundary-scan test unit comprises:
a test card generic connector to communicatively couple the generic boundary-scan test unit to the adapter generic connector of the adapter assembly;
boundary-scan functionality to transmit at least one output test signal;
wherein the test card generic connector is communicatively coupled to the adapter generic connector in order to test the backplane while the backplane operates at signaling speeds by:
communicating the output test signal from the generic boundary-scan test unit to the application-specific mating connector for testing the backplane; and
communicating at least one input test signal received from the backplane via the application-specific mating connector to the boundary-scan functionality of the generic boundary-scan test unit via the adapter generic connector of the adapter assembly and the test card generic connector for testing the backplane.

2. The system of claim 1, further comprising a printed wiring board that communicatively couples the test card generic connector to the adapter generic connector.

3. The system of claim 1, wherein the boundary-scan functionality comprises at least one of Institute of Electrical and Electronics Engineers (IEEE) 1149.6 functionality and IEEE 1149.1 functionality.

4. The system of claim 1, wherein the generic boundary-scan test unit further comprises a boundary-scan bridge to communicatively couple the generic boundary-scan test unit to at least one other generic boundary-scan test unit that is communicatively coupled to an other application-specific port of the backplane in order to form a boundary-scan chain.

5. The system of claim 4, wherein the other generic boundary-scan test unit is communicatively coupled to the other application-specific port of the backplane via another adapter assembly.

6. The system of claim 1, wherein the test card generic connector is reconfigurable, wherein the system further comprises:
a test control computer communicatively coupled to the generic boundary-scan test unit, wherein the test control computer sends at least one control signal to the test card generic connector in order to configure the test card generic connector and transmits the test output signal to the boundary-scan functionality of the generic boundary-scan test unit and receives the test input from the boundary-scan functionality of the generic boundary-scan test unit.

7. The system of claim 6, wherein the test card generic connector comprises a plurality of pins, wherein the test card generic connector is reconfigured by toggling at least one of the pins.

8. The system of claim 1, wherein the boundary-scan functionality of the generic boundary-scan test unit is operable to output test signals to test a plurality of types of backplanes.

9. A method to test a backplane while the backplane operates at signaling speeds, the method comprising:
mating a first adapter assembly to a first application-specific port of the backplane using an application-specific connector of the first adapter assembly;
mating a first generic boundary-scan test unit to the first adapter assembly, wherein the first generic boundary-scan test unit comprises at least one of IEEE 1149.6 functionality, IEEE 1149.1 functionality; and
directing signals to and from the backplane as it operates at said signaling speeds via the first adapter assembly and the first generic boundary-scan test unit.

10. The method of claim 9, further comprising:
mating a second adapter assembly to a second application-specific port of the backplane;
mating a second generic boundary-scan test unit to the second adapter assembly, wherein the second generic boundary scan test card includes functionality to test at least one of alternating current (AC) coupled nets or differential nets; and
directing signals to and from the backplane via the second adapter assembly and the second generic boundary-scan test-card.

11. The method of claim 10 further comprising:
communicatively coupling a first boundary-scan bridge on the first generic boundary-scan test unit to a second boundary-scan bridge on the second generic boundary-scan test unit.

12. The method of claim 11, further comprising:
communicatively coupling the first boundary-scan bridge and the second boundary-scan bridge to a test control computer; and
sending signals to the first boundary-scan bridge wherein at least one of: backplane circuitry associated with the first-application-specific port and backplane circuitry associated with the second-application-specific port comprise at least one of alternating current (AC) coupled nets or differential nets.

13. A method to test a backplane as the backplane operates at signaling speeds, the method comprising:

mating a first adapter-assembly to a first application-specific port of the backplane;

mating a first generic boundary-scan test unit to the first adapter assembly; and directing signals to and from the backplane as it operates at said signaling speeds via the first adapter assembly and the first generic boundary-scan test unit.

14. The method of claim 13, further comprising:

mating a second adapter assembly to a second application-specific port of the backplane;

mating a second generic boundary-scan test-card to the second adapter assembly; and directing signals to and from the backplane via the second adapter assembly and the second generic boundary-scan test unit.

15. The method of claim 14 further comprising:

connecting a first boundary-scan bridge on the first generic boundary-scan test unit to a second boundary-scan bridge on the second generic boundary-scan test unit in order to communicatively couple backplane circuitry associated with the first application-specific port and backplane circuitry associated with the second application-specific port.

16. The method of claim 15, further comprising:

connecting the first boundary-scan bridge and the second boundary-scan bridge to a test control computer; and sending signals from the test control computer to the first boundary-scan bridge in order to test at least one of the backplane circuitry associated with the first application-specific port and the backplane circuitry associated with the second application-specific port.

17. A generic boundary-scan test unit, comprising:

a generic connector to connect the generic boundary-scan test unit with an adapter assembly via a printed wiring board;

a boundary-scan bridge communicatively coupled to the generic connector, wherein the boundary-scan bridge is operable to communicate a test signal generated in accordance with at least one of IEEE 1149.1 and IEEE 1149.6; and boundary-scan functionality communicatively coupled to the boundary-scan bridge operable to communicate with more than one type of application-specific port of the backplane.

18. The generic boundary-scan test unit of claim 17, wherein the generic connector comprises pins adapted for toggling by the boundary-scan functionality according to the test signals received at the boundary-scan bridge and according to the type of application-specific port of the backplane.

19. The generic boundary-scan test unit of claim 17, wherein the boundary-scan bridge is adapted to link to a plurality of other generic boundary-scan test units, wherein a first boundary-scan-test unit is adapted to input the test signals to a first type of application-specific port of the backplane while a second generic boundary-scan test unit is adapted to input the test signal to a second type of application-specific port of the backplane.

20. The generic boundary-scan test unit of claim 17, wherein the boundary-scan bridge is comprises link functionality to link to a plurality of other generic boundary-scan test units, wherein a first generic boundary-scan test unit comprises functionality to input the test signals to a first type of application-specific port of the backplane while a second generic boundary-scan test unit comprises functionality to input the test signals to a second type of application-specific port of the backplane.

* * * * *

UNITED STATES PATENT AND TRADEMARK OFFICE
CERTIFICATE OF CORRECTION

PATENT NO. : 7,478,298 B2  
APPLICATION NO. : 11/340286  
DATED : January 13, 2009  
INVENTOR(S) : Jaworski et al.

Page 1 of 1

It is certified that error appears in the above-identified patent and that said Letters Patent is hereby corrected as shown below:

At Column 1, line 16, after the text ending with "on the same date herewith", insert the following text:
--and are hereby incorporated herein by reference--

At Column 5, line 55, insert the following paragraph:
--The test adapter system 195 is in communication with the test adapter system 395 via connection 410. The boundary scan bridge 190 of the generic boundary-scan test unit 150 of the test adapter system 195 is communicatively coupled to the boundary-scan bridge 190 of the generic boundary-scan test unit 150 of test adapter system 395 via the connection 410. Each of the two generic boundary-scan test units 150 of test adapter system 195 and test adapter system 395 are each communicatively coupled to a respective application-specific ports 230 and 240 of the backplane 200 via the adapter assembly 100 and the adapter assembly 300, respectively.--

At Column 5, line 67, replace the reference numeral "170" with --150--

At Column 10, line 15, replace the text "test output signal" with --output test signal--; at line 17, replace the text "the test input" with --the input test signal--; at line 44, replace the text "boundary-scan test card" with --boundary-scan test unit--; and at line 49, replace the text "test-card" with --test unit--

At Column 11, line 11, replace the text "boundary-scan test-card" with --boundary-scan test unit--

Signed and Sealed this

Sixth Day of October, 2009

David J. Kappos
*Director of the United States Patent and Trademark Office*